United States Patent [19]
Rana et al.

[11] Patent Number: 5,889,462
[45] Date of Patent: *Mar. 30, 1999

[54] MULTILAYER THICK FILM SURGE RESISTOR NETWORK

[75] Inventors: Joseph M. Rana, Providence; Prasanna E. Paralkar, Logan; Bruce L. Jeppesen, Logan, all of Utah

[73] Assignee: Bourns, Inc., Riverside, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 629,142

[22] Filed: Apr. 8, 1996

[51] Int. Cl.$^6$ ............................... H01C 1/02; H01C 1/01
[52] U.S. Cl. ........................... 338/254; 338/276; 338/320
[58] Field of Search ................................ 338/254, 260, 338/276, 320, 319, 328, 312, 314, 292

[56] References Cited

U.S. PATENT DOCUMENTS

| | | | |
|---|---|---|---|
| 4,328,531 | 5/1982 | Nagashima et al. | 361/401 |
| 4,529,835 | 7/1985 | Mizuno | 174/68.5 |
| 4,554,229 | 11/1985 | Small, Jr. | 430/17 |
| 4,870,746 | 10/1989 | Klaser | 29/620 |
| 5,177,341 | 1/1993 | Balderson | 219/543 |
| 5,378,313 | 1/1995 | Pace | 156/643 |
| 5,450,263 | 9/1995 | Desaigoudar et al. | 360/110 |
| 5,475,263 | 12/1995 | Coady et al. | 257/700 |
| 5,560,851 | 10/1996 | Thimm et al. | 219/543 |

FOREIGN PATENT DOCUMENTS

| | | | |
|---|---|---|---|
| 6-77013 | 8/1992 | Japan | H01C 1/06 |

OTHER PUBLICATIONS

Lightning Surge Behavior of Thick Film Metallic Resistors, by Orville Brown et al., EMCA–REMEX Products, Ablestik Electronic Materials and Adhesives, Montgomery, PA.

Lightning and AC Power Fault, TR–NWT–001089, Issue 1, Oct. 1991.

*Primary Examiner*—Peter S. Wong
*Assistant Examiner*—Bao Q. Vu
*Attorney, Agent, or Firm*—Graham & James LLP

[57] ABSTRACT

A surge r or network comprises a substrate layer having a first thick film resistive element, a dielectric layer covering the first thick film resistive element and a second thick film resistive element applied to the dielectric layer. The dielectric layer has a pair of vias that extend therethrough so that the first resistive element is electrically connected to the second resistive element through the vias. A pair of electrical terminals are coupled to the first resistive layer at the substrate. The first resistive element comprises a first pair of unconnected adjacent tracks that each spiral respectively inward in a serpentine pattern. Each one of the tracks has an electrical pad disposed at a first end thereof for attachment to respective ones of the pair of electrical terminals. A second end of the tracks is disposed at a center of each serpentine pattern. The second resistive element comprises a second pair of adjacent tracks that each spiral respectively outward in a serpentine pattern. Each one of the second pair of tracks are coupled to respective ones of the vias at respective ends thereof at a center of each serpentine pattern. The second pairs of tracks are joined together at a trim region disposed between the adjacent tracks.

18 Claims, 3 Drawing Sheets

MULTILAYER THICK FILM SURGE RESISTOR NETWORK

BACKGROUND OF THE INVENTION

1. Field of the Invention

The present invention relates to resistor networks, and more particularly, to a multilayer thick film resistor network adapted for surge protection applications.

2. Description of Related Art

Resistors are electronic devices that oppose current flow without causing any phase shift to a propagating electrical signal. Traditionally, resistors were individually packaged using axial electrical leads that permit the resistor to be electrically connected to other circuit elements, such as to a printed circuit board. In the last several years, however, it has become increasingly common to include multiple resistors within a single package. In such packages, referred to as resistor networks, the resistors may either be isolated from each other or internally connected together or to a common terminal pin. Examples of common resistor network packaging include single in-line packages (SIP) and dual in-line packages (DIP) used for through-hole or socket mounting onto a printed circuit board, or flat-pack and leadless chip configurations used for surface mounting onto a printed circuit board. Resistor networks enable manufacturers to minimize space and routing problems, reduce manufacturing cost per installed resistive function, and increase circuit board yields and reliability by reducing component counts.

In the telecommunications industry, resistors are used to provide protection to sensitive circuitry that may be exposed to electrical surges resulting from lightning and/or commercial power system disturbances. A surge is defined as a high-energy, short-duration voltage, current or power pulse. Despite the presence of protective devices in a telephone network that limit the effects of such surges, a portion of these disturbances may be impressed on the network equipment. If a telephone network is not properly protected against surges, the consequences may include permanent damage to internal network components and temporary instability to a telephone system. For this reason, surge resistors are commonly used in telephone networks as well as within television, facsimile, computers and other data processing equipment.

A surge resistor network provides a pair of resistors that respectively limit surge current into the tip and ring telecommunication terminals. The impedance value of the resistors is selected so as to not degrade the operating signal on the protected line, but must be high enough to ensure protection. In order to satisfy accepted telecommunications industry standards, such as IEC 801–5, ANSI/IEEE C62.41 and Bellcore TR-NWT-001089, the resistors must be capable of dissipating high energy for a short period of time. It is advantageous to include the pair of resistors within a single resistor network package in order to achieve better impedance matching between the resistors for noise reduction purposes, in addition to the other advantages of resistor networks described above.

There is a continuing need throughout the electronics industry to reduce device dimensions without impacting device functionality. In this regard, most sectors of the electronics industry have witnessed rapid advancements in miniaturization, particularly in the area of integrated circuits. In contrast, surge resistor networks have not benefited to the same degree as other electronic devices from such advances in miniaturization due to the need to maintain resistor surge characteristics that depend directly on device width and trace separation. Accordingly, it would be advantageous to provide a surge resistor network having a reduced physical size without compromising device capability.

SUMMARY OF THE INVENTION

In accordance with the teachings of the present invention, a surge resistor network is provided within a multilayer structure that requires less physical space than conventional surge resistor networks without degradation of power rating and surge properties.

Particularly, the resistor network comprises a ceramic substrate having successive thick film layers applied thereto. A first thick film resistive element layer is applied directly to the substrate and a dielectric thick film layer is then applied over the first resistive element layer. A second thick film resistive element layer is then applied over the dielectric layer. A pair of vias extend through the dielectric layer so that the first resistive element is electrically connected to the second resistive element through the vias. A pair of electrical terminals are coupled to the first resistive layer at the substrate. The first and second resistive elements combine to provide a single surge resistor. One or more additional such surge resistors could be formed within a single resistor network package.

More specifically, the first resistive element comprises a first pair of unconnected adjacent tracks that each spiral respectively inward in a serpentine pattern. Each one of the tracks has an electrical pad disposed at a first end thereof for attachment to respective ones of the pair of electrical terminals. A second end of the tracks is disposed at a center of each serpentine pattern, where the vias are respectively formed. The second resistive element comprises a second pair of adjacent tracks that each spiral respectively outward in a serpentine pattern. Each one of the second pair of tracks are coupled to respective ones of the first pair of tracks through the vias at a center of each serpentine pattern. The second pairs of tracks are joined together at a trim region disposed between the adjacent tracks.

A more complete understanding of the multilayer thick film resistor network will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention satisfies the need to reduce surge resistor network device dimensions without impacting device functionality or capability. In the detailed description that follows, it should be appreciated that like element numerals are used to describe like elements in one or more of the figures.

Figure 1A:
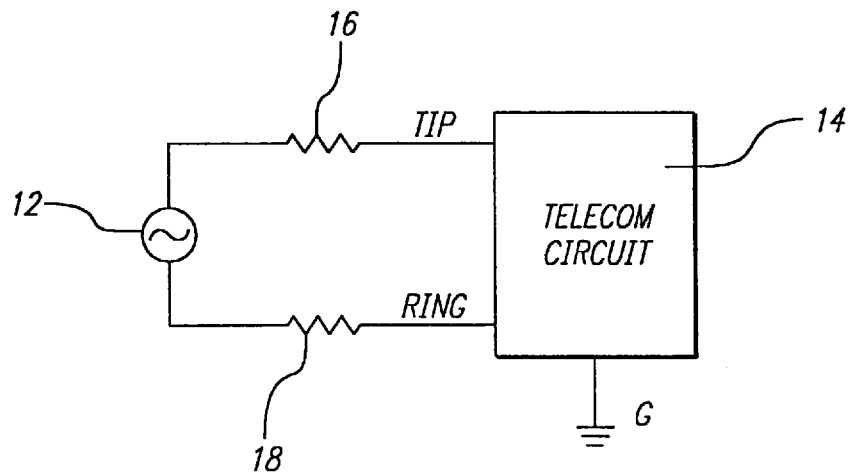
FIGS. 1A and 1B illustrate prior art surge resistor networks used to protect a telecommunication circuit against two common surge modes.
Figure 1B:
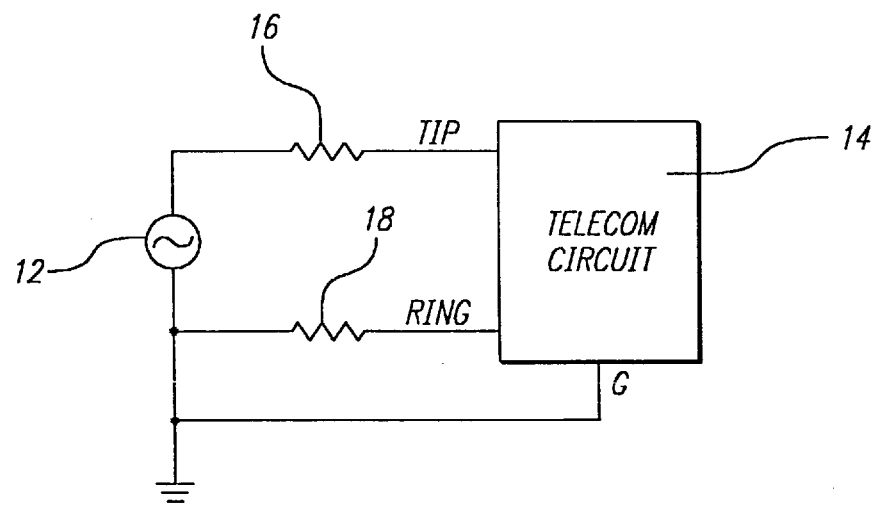

Referring first to FIGS. 1A and 1B, two common surge modes are illustrated in association with th e tip and ring terminals of a typical telecommunication circuit 14. The surge modes include: (1) the metallic, i.e., normal, transverse or differential mode (FIG. 1A) ; and, (2) the longitudinal, i.e., common mode (FIG. 1B). In the metallic mode, the earth or ground terminal is not involved. Instead, a surge 12 generates surge current that flows from the tip to the ring, or vice versa. In the longitudinal mode, a connection is made between one or more of the tip and ring terminals and ground. The longitudinal surge current flows both from the tip to ground and from the ring to ground.

In either mode, two high-power surge resistors 16, 18 are coupled respectively to the tip and ring terminals to protect the sensitive telecommunication circuitry from lightning strikes and power-cross conditions by limiting irregular currents through the system. The resistors 16, 18 generally have a resistance range between 35 and 100 ohms. It is critical that the actual resistance values of the individual surge resistors 16, 18 be matched to prevent current imbalances that can result in noise being applied to the tip and ring terminals.

Figure 2:
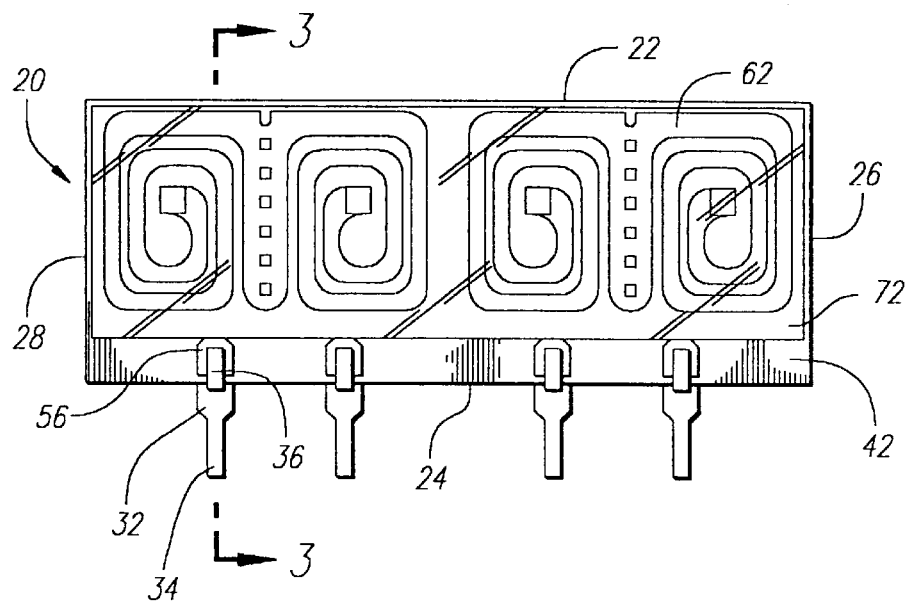
FIG. 2 is a front view of a multilayer surge resistor network of the present invention.

Referring now to FIG. 2, a multilayer surge resistor network 20 of the present invention is illustrated. The resistor network 20 comprises a single in-line package (SIP) useful for through-hole or socket mounting onto a printed circuit board. The resistor network 20 has an upper edge 22, side edges 26, 28, and a lower edge 24. Electrical leads 32 couple the resistor network 20 to a circuit board, and have a tapered portion 34 that can be inserted into a mounting hole or socket for electrical connection to the circuit board. Two adjacent ones of the electrical leads 32 provide electrical coupling to a single surge resistor within the resistor network 20. Accordingly, the surge resistor network 20 shown in FIG. 2 provides a matched pair of surge resistors.

Figure 3:
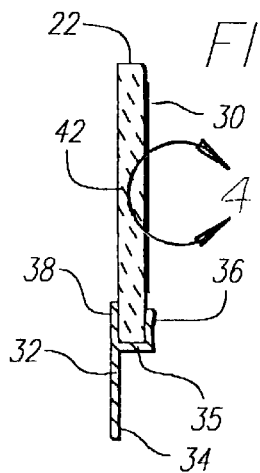
FIG. 3 is a sectional side view of the multilayer surge resistor network taken through the section 3—3 of FIG. 2.
Figure 5:
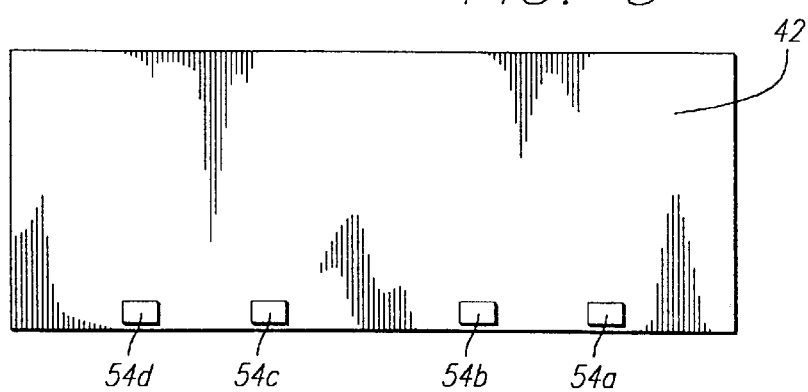
FIG. 5 is a rear view of a substrate layer of the multilayer surge resistor network.

The resistor network 20 and one of the electrical leads 32 are illustrated in cross-section in FIG. 3. The resistor network 20 further comprises a multilayer structure applied to a substrate layer 42. The rearward facing surface of the substrate layer 42 is shown in FIG. 5 as having a plurality of pads 54*a–d* that provide a solder bond between the resistor network 20 and the electrical leads 32. Each electrical lead 32 has a rear contact 38 that is soldered to a respective one of the pads 54. The solder bond between the pads 54*a–d* and the leads 32 improves the adherence of the lead to the resistor network 20.

The leads 32 further have a horizontally disposed bridge element 35 that extends perpendicularly from the plane of each lead in the direction of a front surface of the substrate 42. A crimping element 36 extends upward vertically from the bridge element 35, and is coupled to respective contact pads 56*a–d* that are applied to the front surface of the substrate 42. The crimping elements 36 are soldered to respective ones of the contact pads 56*a–d* to provide an electrical connection between the leads 32 and the resistor network 20. The crimping element 36 may also have a natural spring bias that causes the lead 32 to tightly grip the multilayer resistor network 20, providing the leads with sufficient pull strength to withstand undesired separation from the resistor network.

Figure 6:
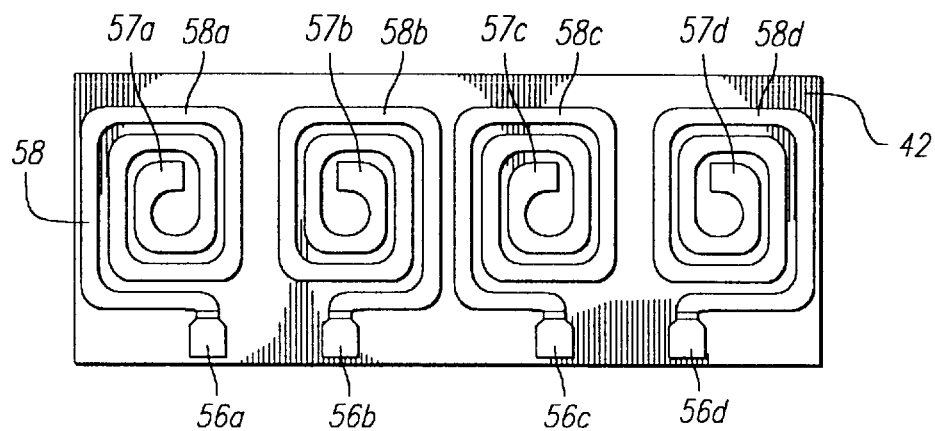
FIG. 6 is a front view of the substrate layer having a first resistive layer applied thereto.

The forward facing surface of the substrate layer 42 is illustrated in FIG. 6. The substrate layer 42 is comprised of a thermally conductive, electrically insulative material, such as ceramic. In a preferred embodiment of the present invention, an aluminum oxide ceramic is utilized, although other complex oxide ceramics such a stearate, fosterite, porcelain, zirconia, or beryllia may also be advantageously utilized. The substrate layer 42 has a generally rectangular shape with smooth and flat forward and rearward facing surfaces. The contact pads 56*a–d* are applied directly to the forward facing surface of the substrate layer 42, as will be described in greater detail below.

Resistive tracks 58*a–d* are printed onto the forward facing surface of the substrate layer 42 in the form of a spiral or serpentine pattern. The spiral resistive track patterns are generally rectangular with rounded corners for reduced current crowding or current density, with the pattern having a respective termination point 57*a–d* at an innermost region of the pattern. An outermost end of the resistive tracks are coupled to respective ones of the contact pads 56*a–d*, providing an electrical connection to the electrical leads 32. As known in the art, the serpentine pattern provides good heat dissipation and uniform current flow. In a preferred embodiment of the resistor network 20, a resistive track width will range between 17 and 21 mils, with a standard track width of 21 mils. The spacing between the adjacent coils of each resistive track will range from 15 to 20 mils, and for better arcing protection, a spacing of 20 mils is preferred.

As known in the art, the resistive tracks 58*a–d* are applied to the substrate layer 42 using a silkscreening process. The resistive tracks 58*a–d* are each provided in the form of a paste that is applied using a mechanized precision stenciling process using screens of stainless steel or nylon. The paste is forced through the screen by a hard rubber squeegee. The serpentine shape of the resistive tracks 58*a–d* is controlled by small openings in the fine mesh screen that correspond to the desired pattern.

To provide the contact pads 54*a–d* and 56*a–d*, a conductive metal paste, such as palladium-silver, is applied to the first substrate layer 52, after which the substrate is fired at a temperature of approximately 850° C. to remove all the solvent and binder. The paste that provides the resistive track 58 is generally comprised of finely powdered inorganic solids (e.g., metals and metal oxides) mixed with a powdered glass binder (e.g., glass frit) and suspended in an organic vehicle (e.g., a resin mixture). The metal materials used for the resistive tracks 58 may include silver, palladium, platinum, ruthenium, rhodium and/or gold. Printing and firing of the resistive tracks 58 is preferably performed in a humidity and temperature controlled environment. For example, a controlled temperature kiln with various temperature zones between 800° C. and 1,200° C. may be used to burn off the organic vehicle and cause a fusion of the glass particles with the ceramic substrate layer 52. The metallic particles provide a resistive film which is bonded to the substrate layer 42 as the resistive tracks 58. Alternatively, the conductive pads 54, 56 and resistive tracks 58 may be fired simultaneously.

Figure 4:
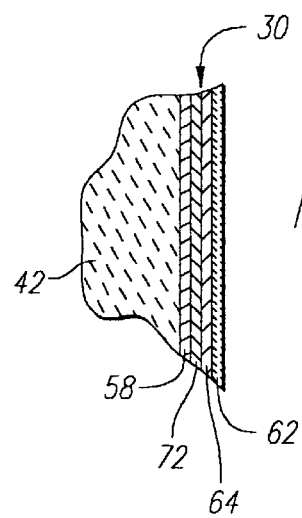
FIG. 4 is an enlarged sectional side view of the region 4—4 of FIG. 3.
Figure 7:
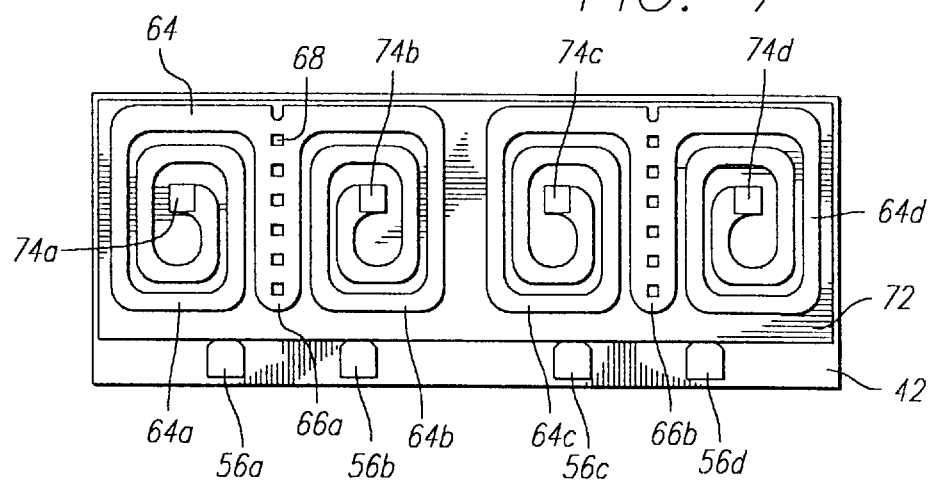
FIG. 7 is a front view of the substrate layer having a dielectric layer and a second resistive layer applied over the first resistive layer.

Referring now to FIG. 7, the forward facing surface of the substrate layer 42 is illustrated having a dielectric layer 72 substantially covering the resistive tracks 58 (also shown in cross-section in FIG. 4). Resistive tracks 64*a–d* are then printed onto the dielectric layer 72 in the form of spiral or serpentine patterned tracks using the same method and materials as described above with respect to the resistive tracks 58*a–d*. The first pair of tracks 58*a*, 58*b* combine with resistive tracks 64*a*, 64*b* to provide a first resistor, and the second pair of tracks 58*c*, 58*d* combine with resistive tracks 64c, 64d to provide a second resistor, as will be described in greater detail below. The isolating capability of the dielectric layer 72 prevents undesired electrical paths from forming between portions of the resistive tracks 58 and 64 that would impair operation of the resistive network 20. At a central termination point defined at an innermost region of the patterns, vias 74a–d are formed in the dielectric layer 72. The vias 74a–d coincide with the central termination points 57a–d of the resistive tracks 58. Accordingly, an electrical connection is made between the resistive tracks 58 and the resistive tracks 64 through the vias 74.

The two interconnected resistive tracks 58, 64 function together as one single unit. A single resistor is formed by the electrical path from one pad 56a, to the serpentine path of resistive track 58a, through the via 74a, to the serpentine path of the resistive tracks 64a and 64b, through the via 74b, to the resistive track 58b, to the pad 56b. A second resistor is formed by the resistive tracks 58c, 58d, 64c, and 64d.

Unlike the resistive tracks 58, each adjacent pair of spiral track patterns 64a, 64b and 64c, 64d join together in central trim regions 66a, 66b, respectively. The width and spacing requirements of the resistive tracks 64 are substantially the same as that of the resistive track 58. The trim region 66 is substantially wider than the individual coils of the resistive track 64, and extends between adjacent pairs of the resistive tracks. The trim region 66 terminates at a rounded end, and has a plurality of rectangular cut-outs 68.

With the trim region 66 on an exposed forward facing surface of the substrate layer 42, the resistive track 64 may be precision trimmed by a laser in order to accurately provide a desired resistance value. In this process, portions of the trim region 66 are burned away by the laser to form the cut-outs 68 while monitoring a resistance value of the resistive element. This way, a pair of resistors can be trimmed to precisely match the desired resistances of the resistor network 20.

As illustrated in FIG. 4, a passivating layer 62 is screened over the exposed tracks 64 and dielectric layer 72 after the laser trimming step is completed. The passivating layer 62 seals the resistive track 64 within the resistor network 20. Thereafter, the leads 32 are coupled to the resistor network 20 in the manner described above.

The resistor network 20 described above and illustrated in the figures comprises two resistors that would couple to the tip and ring terminals of a telecommunication circuit. It should also be apparent any other number of resistors could be included in a single device as required. Moreover, a greater number of resistive and dielectric layers could be added to the resistor network in a similar manner to further alter the resistive characteristics of the resistor network without substantially increasing the package size. The resistors of the resistor network 20 can be produced with various resistance values within a range of 40 to 200 ohms with a typical tolerance of +/–0.5%.

Having thus described a preferred embodiment of a multilayer thick film surge resistor network, it should be apparent to those skilled in the art that certain advantages of the within system have been achieved. It should also be appreciated that various modifications, adaptations, and alternative embodiments thereof may be made within the scope and spirit of the present invention. For example, the resistor network 20 described above is in the form of a single in-line package; however, the resistor network could alternatively be constructed within a dual in-line package or leadless package, depending upon the ultimate application for the resistor network.

The invention is further defined by the following claims. What is claimed is:

1. A surge resistor for protecting a telecommunication circuit from a power surge generated from a lightning strike, comprising:

a substrate layer having a first portion of a thick film resistive element applied thereto;

a dielectric layer applied to said substrate layer substantially covering said first portion of a thick film resistive element and having a second portion of said resistive element applied thereto, said dielectric layer having a pair of vias that extend therethrough, said first portion of said resistive element being electrically connected to said second portion of said resistive element through said vias, said first and second portions each being disposed in a pattern that provides uniform current flow and a relatively long physical length in relation to an overall package size of said resistor; and a pair of electrical terminals coupled to said first portion of said resistive element at said substrate layer;

wherein, said first and second portions of said resistive element combine electrically to provide a single multilayer surge resistor capable of absorbing an electrical surge caused by a lightning strike and dissipating generated heat, thereby protecting said telecommunication circuit from said electrical surge, and wherein said second portion of said resistive element comprises a trim region on an exposed surface of said dielectric layer, said trim region adapted to allow precision trimming of said multilayer surge resistor at said dielectric layer while a resistance value of said multilayer surge resistor is being monitored through said pair of electrical terminals at said substrate layer.

2. The surge resistor network of claim 1, wherein said first portion of said resistive element comprises a first pair of unconnected adjacent tracks that each spiral respectively inward in a serpentine pattern, each said track having an electrical pad disposed at a first end thereof for attachment to respective ones of said pair of electrical terminals and a second end at a center of each serpentine pattern.

3. The surge resistor network of claim 2, wherein said second portion of said resistive element comprises a second pair of adjacent tracks that each spiral respectively outward in a serpentine pattern, each one of said second pair of tracks being coupled to said at least one via at respective ends thereof at a center of each said serpentine pattern, and being joined together at a trim region disposed between said adjacent tracks.

4. The surge resistor network of claim 1, wherein said first and second portions of said resistive element are each comprised of a material selected from a group including silver, palladium, platinum, ruthenium, rhodium and gold.

5. The surge resistor network of claim 1, wherein said substrate layer is comprised of aluminum oxide.

6. The surge resistor network of claim 1, further comprising a passivating layer applied to said substrate substantially covering said second portion of said resistive element.

7. The surge resistor network of claim 1, wherein said first substrate layer has two of said first portions of said resistive element applied thereto, and said second substrate layer has two of said second portions of said resistive element applied thereto, said first and second portions of said resistive element providing a matched pair of surge resistors.

8. A method for making a surge resistor for protecting a telecommunication circuit from a power surge generated from a lightning strike, comprising the steps of:

printing a first pair of thick film resistive tracks onto a substrate layer;

applying a dielectric layer onto said substrate layer substantially covering said first pair of resistive tracks;

forming conductive vias through said dielectric layer at respective ends of said first pair of resistive tracks;

printing a second pair of thick film resistive tracks onto said dielectric layer, said second pair of resistive tracks being joined together by a central trim region located on an exposed surface of said dielectric layer, said conductive vias electrically coupling the first pair of resistive tracks to the second pair of resistive tracks, wherein said first and second pairs of said resistive tracks combine electrically to provide a single multilayer surge resistor; and monitoring an electrical resistance of said multilayer surge resistor while trimming said central trim region to accurately provide a desired resistance value.

9. The method of claim 8, further comprising the step of covering said second pair of resistive tracks with a passivating layer.

10. The method of claim 8, wherein said substrate layer is comprised of aluminum oxide material.

11. The method of claim 8, wherein said resistive tracks are comprised of a material selected from a group including silver, palladium, platinum, ruthenium, rhodium and gold.

12. The method of claim 9, further comprising the step of coupling electrical leads to said first resistive tracks.

13. A surge resistor, comprising:

a substrate layer;

a single resistive element comprising a plurality of thick film layers successively applied to said substrate layer;

at least one dielectric layer separating successive ones of said thick film layers, said at least one dielectric layer having vias that extend therethrough to couple said successive ones of said thick film layers together serially, an uppermost one of said thick film layers providing a trim region;

terminal means for electrically coupling to said resistive element, thereby forming a single, multilayer surge resistor; and an exposed trim region formed on an uppermost one of said thick film layers, said trim region adapted to allow precision trimming of said multilayer surge resistor while a resistance value of said multilayer surge resistor is being monitored through said terminal means.

14. The surge resistor network of claim 13, wherein said substrate layer is comprised of aluminum oxide.

15. The surge resistor network of claim 13, wherein each of said thick film layers further comprises an unconnected track that spirals in a serpentine pattern.

16. The surge resistor network of claim 15, wherein said unconnected tracks of said thick film layers are connected to each other by respective ones of said vias.

17. The surge resistor network of claim 13, wherein said thick film layers are comprised of a material selected from a group including, silver, palladium, platinum, ruthenium, rhodium and gold.

18. The surge resistor network of claim 13, further comprising a passivating layer applied to an uppermost one of said thick film layers.

* * * * *